United States Patent [19]

Hurd et al.

[11] Patent Number: 5,262,723
[45] Date of Patent: Nov. 16, 1993

[54] METHOD AND APPARATUS FOR OBTAINING PURE-ABSORPTION TWO-DIMENSIONAL LINESHAPE DATA FOR MULTIDIMENSIONAL NMR SPECTROSCOPY USING SWITCHED ACQUISITION TIME GRADIENTS

[75] Inventors: Ralph E. Hurd, Milpitas; Boban K. John, Fremont; Harris D. Plant, Salida, all of Calif.

[73] Assignee: General Electric Company, Waukesha, Wis.

[21] Appl. No.: 727,203

[22] Filed: Jul. 9, 1991

[51] Int. Cl.$^5$ ............................................. G01R 33/20

[52] U.S. Cl. ................................. 324/309; 324/307

[58] Field of Search ............... 324/309, 307, 300, 314, 324/312

[56] References Cited

U.S. PATENT DOCUMENTS

| | | | |
|---|---|---|---|
| 3,674,998 | 7/1972 | Benz | 235/151.3 |
| 4,238,735 | 12/1980 | Muller | 324/310 |
| 4,510,449 | 4/1985 | Ernst et al. | 324/311 |
| 4,680,546 | 7/1987 | Dumoulin | 324/307 |
| 4,766,377 | 8/1988 | Ohuchi et al. | 324/309 |
| 4,766,380 | 8/1988 | Den Boef | 324/309 |
| 4,789,832 | 12/1988 | Nagayama | 324/307 |
| 4,893,080 | 1/1990 | Luyten et al. | 324/307 |
| 4,972,147 | 11/1990 | Van Vaals | 324/307 |
| 5,045,790 | 9/1991 | Hall et al. | 324/307 |
| 5,077,524 | 12/1991 | Hurd et al. | 324/322 |
| 5,101,158 | 3/1992 | Hall et al. | 324/307 |

FOREIGN PATENT DOCUMENTS 9201235 1/1992 PCT Int'l Appl. .................. 33/46

OTHER PUBLICATIONS

Keeler et al. "Comparison and Evaluation of Methods for 2 dimensional NMR spectra with Absorbtion Mode Lineshapes" Journal of Magnetic Resonance 63, 454–472 (1985).
Ernst et al. "Principles of Nuclear Magnetic Resonance in One and Two Dimensions" Claredon Press. Oxford (1987).
Hurd, "Gradient-Enhanced Spectroscopy," J. of Mag. Res. 87 422–428 (1990).
Ralph E. Hurd and Boban K. John, "Gradient-Enhanced Proton-Detected Heteronuclear Multiple-Quantum Coherence Spectroscopy," Journal of Magnetic Resonance 91, 648–653 '91.
Horst Kessler, et al. "Two-Dimensional NMR Spectroscopy: Background and Overview of the Experiments," Angew. Chem Int. Ed. Engl. 27 (1988) 490–536.
Davis, et al., "Absorption-Mode Two-Dimensional NMR Spectra Recorded Using Pulsed Field Gradients," Journal of Magnetic Resonance 94 (1991), Oct. 1, No. 3, Duluth, Minn.
Sotak, et al., "The Unequivocal Determination of in Vivo Lactic Acid Using Two-Dimensional Double-Quantum Coherence-Transfer Spectroscopy," Journal of Magnetic Resonance 78 (1988), pp. 355–361.
Barker, et al., "Lineshapes in Phase-Encoded Spectroscopic Imaging Experiments," Journal of Magnetic Resonance 75 (1987), Dec., No. 3, Duluth, Minn.
Brereton, et al., "Quadrature Detection in $F_1$ Induced by Pulsed Field Gradients," Journal of Magnetic Resonance 93 (1991), Jun. 1, No. 1, Duluth, Minn.

Primary Examiner—Michael J. Tokar
Assistant Examiner—Raymond Y. Mah
Attorney, Agent, or Firm—Townsend and Townsend Khourie and Crew

[57] ABSTRACT

A signal function $S(t_1, t_2)$ is obtained from a plurality of coherence transfer pathways in a single acquisition by preparing a molecular system in a coherent non-equilibrium state, and alternately and sequentially detecting signals at individual sampling points, in $t_2$, from the plurality of coherence transfer pathways by using gradient refocusing of a new pathway after signal detection at a sampling point in another pathway. A frequency domain spectrum $S(\omega_1,\omega_2)$ is constructed by first Fourier transforming the time domain signals $S(t_1, t_2)$ in the $t_2$ dimension and producing real and imaginary components which modulate as sine and cosine signals in $t_1$. The real ($\omega_2$) cosine ($t_1$) components are combined with the imaginary ($\omega_2$) sine ($t_1$) components to form a complex data set $S(t_1, \omega_2)$ that is amplitude modulated in $t_1$. The complex data set is then Fourier transformed in the $t_1$ dimension to construct in frequency domain spectrum $S(\omega_1, \omega_2)$ which contains pure absorption lineshapes.

3 Claims, 6 Drawing Sheets

GE-COSY-SWAT

METHOD AND APPARATUS FOR OBTAINING PURE-ABSORPTION TWO-DIMENSIONAL LINESHAPE DATA FOR MULTIDIMENSIONAL NMR SPECTROSCOPY USING SWITCHED ACQUISITION TIME GRADIENTS

This application is related to our co-pending application Ser. No. 07/678,831, filed Apr. 2, 1991, for "Multidimensional NMR Spectroscopy Using Switched Acquisition Time Gradients For Multiple Coherence Transfer Pathway Detection", now U.S. Pat. No. 5,168,229 issued Dec. 1, 1992.

BACKGROUND OF THE INVENTION

This invention relates generally to magnetic resonance spectroscopy, and more particularly the invention relates to multidimensional NMR spectroscopy using switched acquisition time (SWAT) gradients for detecting multiple coherence transfer pathways following a single magnetic excitation sequence.

Nuclear magnetic resonance (NMR) spectroscopy is a method that is used to study the structure and dynamics of molecules. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils.

A general description of the principles of NMR is given by Ernst et al. in *Principles of Nuclear Magnetic Resonance in One and Two Dimensions*, Clarendon Press, Oxford 1987.

Briefly, a strong static magnetic field is employed to line up atoms whose nuclei have an odd number of protons and/or neutrons, that is, have spin angular momentum and a magnetic dipole moment. A second, rf, magnetic field, applied as a pulse transverse to the static magnetic field ($B_0$), is then used to pump energy into these nuclei, causing them to precess relative to the static field ($B_0$), by a fixed tip angle for example, 90° or 180°. After excitation the nuclei gradually return to alignment with the static field and give up the energy in the form of weak but detectable free induction decay (FID) signals. These FID signals are used by a computer to produce spectra.

The excitation frequency is defined by the Larmor relationship which states that the angular frequency $\omega_0$, of the precession of the nuclei is the product of the magnetic field, $B_0$, and the so-called magnetogyric ratio, $\gamma$, a fundamental physical constant for each nuclear species:

$$\omega_0 = B_0 \cdot \gamma$$

The angle of nuclear spin tip in response to an rf pulse excitation is proportional to the integral of the pulse over time.

Multidimensional NMR spectroscopy provides a method for studying the structure, dynamics, and reactions of molecules. The interaction between the magnetic moments of atomic nuclei and magnetic fields are a function of two or more frequency variables providing a signal function $S(\omega_1,\omega_2,\omega_3\ldots)$ which contains detailed chemical information. The pulse sequence of a multidimensional NMR procedure includes preparation of the nuclear spins by interaction of the nuclear magnetic moments and applied magnetic fields, evolution of the magnetic moments over a time ($t_1$), magnetization transfer, between nuclei (e.g. hydrogen to carbon), and detection over a time ($t_2$). Signals from various coherence transfer pathways can be detected using a sequence of rf and gradient pulses for selection. Heretofore, a signal from a single pathway has been sampled at a plurality of points in time following excitation and evolution. The sampling of a plurality of coherence transfer pathways has required sequential rf excitations with a unique magnetic gradient sequence for each pathway, thus necessitating multiple acquisitions. Fourier transformation is utilized to analyze the detected signals.

In general, the effect of a pulsed magnetic field gradient on the nuclear spins can be understood by describing the state of the spin system in terms of density operators. The density operator $\rho(t)$ of the spin system at any time t can be classified according to the various coherence orders:

$$\rho(t) = \sum_p \rho^P(t), \quad [1]$$

where p represents the coherence order. The Hamiltonian of the system during the gradient pulse is predominantly from Zeeman contributions. Classification of the density operator into its various components is convenient, since the effect of a field gradient pulse of duration $\tau$ can be written as $$\rho^P(t-) \xrightarrow{\exp\{i\omega_z(r)F_z\tau\}} \exp\{-ip\omega_z(r)\tau\}\rho^P(t+) \quad [2]$$

where $\rho(t-)$ and $\rho(t+)$ are used to label the density operator before and after the gradient pulse, and $F_z$ is the z component of the total angular momentum. The Zeeman fields experienced by the various spins in the sample vary according to their spatial coordinates. It can be seen from equation [2] that the gradient pulse introduces a complex phase factor into, the density operator component. This phase factor depends on the coherence order of the component and on the area of the gradient pulse. Essentially, the effect of the gradient pulse is to defocus the coherence by a controlled amount. Each of the coherence pathways can be thought to be "coherence order labeled" by the gradients. Selection of a particular pathway is then accomplished by applying a rephasing gradient pulse integral of $\omega^R z(r) \tau^R$, which transforms the density operator, described by $\Sigma C_k \rho^{(-1)}\exp\{-i\phi_k\}$ where k denotes a particular coherence pathway, $\phi_k$ is the phase dispersal, $c_k$ denotes all of the time dependence and $\rho^{(-1)}$ denotes the observable component corresponding to $p=-1$. The refocusing gradient transforms the density operator as shown:

$$\sum_k c_k\rho^{(-1)}\exp\{-i\phi_k\} \xrightarrow{\exp\{i\psi_z^R(r)F_z\tau^R\}} c_l\tau(-1) + \sum_{k\neq l} c_k\rho^{(-1)}\exp\{-i(\phi_k + \omega_z^R(r)\tau^R)\} \quad [3]$$

where l is the desired pathway. The first term on the right hand side of equation [3] corresponds to the pathway which has been exactly refocused and is hence observable, since $$\phi_I = -\omega_z{}^R(r)\tau^R. \qquad [4]$$

The second term denotes all the other pathways which are still defocused and are not observable.

Equation [2] describes the central property of all coherence transfer selection schemes. In conventional NMR, each coherence component accumulates phase factors during the various cycles of the phase cycle scheme. The receiver phase cycle is then determined such that only the desired pathway yields a signal. In an experiment where pulsed gradients are used, each of the gradient pulses contributes to the cumulative phase factors of the various coherence components. The desired pathway can then be selected by choosing the area of the gradient prior to data acquisition, so that only the desired signal component is refocused. A major feature of gradient selection of coherence pathways is that the selection is accomplished in a single acquisition, unlike rf phase cycling, where multiple acquisitions are required. The major limitation of conventional gradient selection has been the loss of all but a single pathway, and hence usually the loss of the square root of 2 in signal to noise and loss of the potential for pure-absorption 2D line shapes.

Disclosed in our co-pending application Ser. No. 678,831, supra, is a multidimensional spectroscopy method and NMR apparatus for encoding and detecting signals from multiple coherence transfer pathways in a single acquisition sequence, in an easily separable fashion. Briefly, the spin system of a sample is prepared in a coherent non-equilibrium state as in conventional multi-dimensional NMR spectroscopy using a single pulse sequence. Thereafter, a plurality of coherence transfer pathways are alternately and repetitively selected and sampled by switching acquisition time gradients in a single NMR acquisition. Fourier analysis of the signals acquired from the plurality of coherence transfer pathways can then be used in constructing a multidimensional spectrum map on the spin system.

More particularly, by switching acquisition time gradients, either the $B_0$ field gradients or rf gradients, each pathway can be individually refocused between sampling points and digitized during acquisition of the detected signals. Thus, in the course of a time period equal to the normal sampling interval, signals arising from all of the desired coherence pathways are individually encoded and detected.

SUMMARY OF THE INVENTION

An object of the present invention is an improved method of obtaining NMR spectroscopy data using the above-described apparatus for encoding and detecting signals from multiple coherence transfer pathways using switched acquisition time gradients.

A feature of the invention is the use of quadrature detection and selective combination of sine and cosine modulated NMR signals in reconstructing NMR data.

Briefly, 2D time domain spectroscopy signals $S(t_1,t_2)$ are quadrature detected and Fourier transformed in the $t_2$ dimension to form complex signals including sine and cosine components. The switching of acquisition time gradients during the detection period causes the sine components to alternate by 180 degrees in phase and shift by the Nyquist frequency. The cosine component is not affected. Further, the imaginary (quadrature) sine components of the detected signal are shifted in phase to absorptive as are the real (in-phase) cosine components and are combined therewith to form a complex data set $S(t_1,\omega_2)$ that is amplitude modulated in $t_1$. The reconstructed data is then complex Fourier transformed to yield a phase sensitive COSY spectrum, $S(\omega_1,\omega_2)$.

The invention and objects and features thereof will be more readily apparent from the following detailed description and appended claims when taken with the drawings.

DETAILED DESCRIPTION OF ILLUSTRATIVE EMBODIMENTS

Figure 1A:
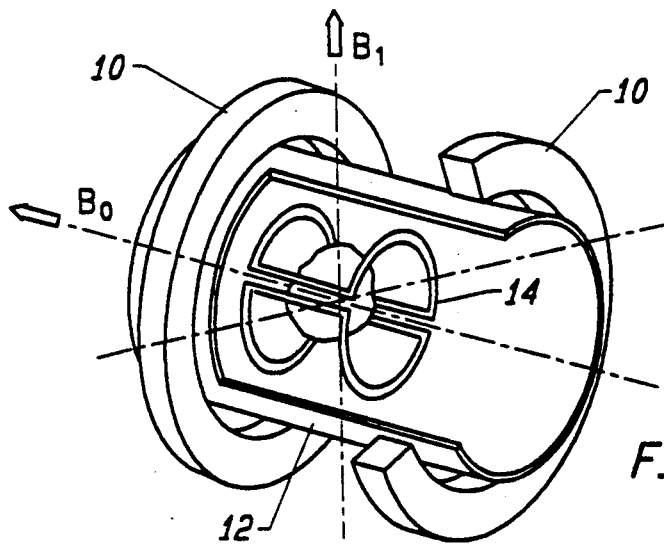
FIGS. 1A–1D illustrate the arrangement of conventional NMR apparatus magnetic fields generated therein.

Referring now to the drawings, FIG. 1A is a perspective view partially in section illustrating coil apparatus in an NMR system, and FIGS. 1B–2D illustrate field gradients which can be produced in the apparatus of FIG. 1A. This apparatus is discussed in Hinshaw and Lent, "An Introduction to NMR Imaging: From the Bloch Equation to the Imaging Equation," Proceedings of the IEEE, Vol. 71, No. 3, March 1983, pp. 338–350. Briefly, the uniform static field $B_0$ is generated by the magnet comprising the coil pair 10. A gradient field $G(x)$ is generated by a complex gradient coil set which can be wound on the cylinder 12. An rf field $B_1$ is generated by an rf coil 14. A sample being studied would be positioned along the Z axis within the rf coil 14.

Figures 1B, 1C, 1D:
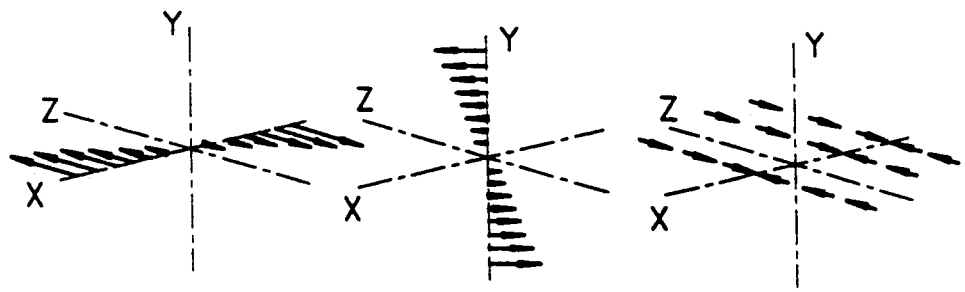

In FIG. 1B an X gradient field is shown which is perpendicular to the static field $B_0$ and varies linearly with distance along the X axis but does not vary with distance along the Y or Z axes. FIGS. 1C and 1D are similar representations of the Y gradient and Z gradient fields, respectively.

Figure 2:
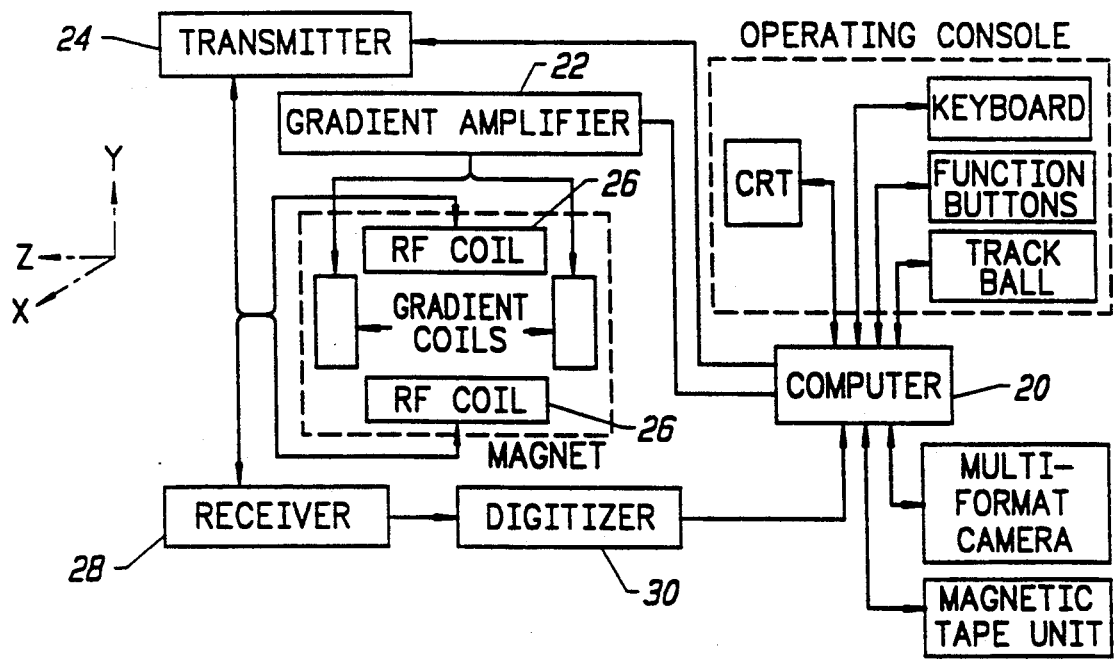
FIG. 2 is a functional block diagram of NMR and spectroscopy apparatus.

FIG. 2 is a functional block diagram of the NMR apparatus as disclosed in NMR-A Perspective on Imaging, General Electric Company, 1982. A computer 20 is programmed to control the operation of the NMR apparatus and process FID signals detected therefrom. The gradient field is energized by a gradient amplifier 22, and the rf coils for generating $B_1$ field at the Larmor frequency are controlled by the transmitter 24 and the rf coils 26. After the selected nuclei have been excited, the rf coils 26 are employed to detect the FID signal which is passed to the receiver 28 and thence through digitizer 30 for processing computer 20.

As noted above, in multidimensional Fourier spectroscopy the properties of a molecular system are characterized through acquisition and analysis of a signal. For example, in two dimensional NMR, the signal is a function $S(\omega_1,\omega_2)$ of two independent variables. A time domain signal $S(t_1,t_2)$ is measured as a function of two independent time variables and is converted by 2D Fourier transformation into the 2D frequency domain spectrum $S(\omega_1,\omega_2)$. The signal $S(t_1,t_2)$ can be obtained by incrementing the time interval $t_1$ and recording the NMR signal as a function of $t_2$.

The spin system is first prepared in a coherent non-equilibrium state by using one or more rf pulses. The spin system then evolves which determines the frequencies in the $\omega_1$-domain. The detected signal can arise from multiple coherence transfer pathways which conventionally are individually selected by applying rephasing gradient pulses for the selected pathway.

Figure 3A:
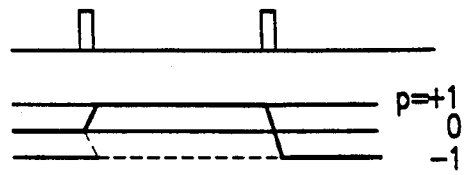
FIGS. 3A and 3B illustrate coherence transfer pathways for single-quantum coherence and double-quantum coherence respectively.
Figure 3B:
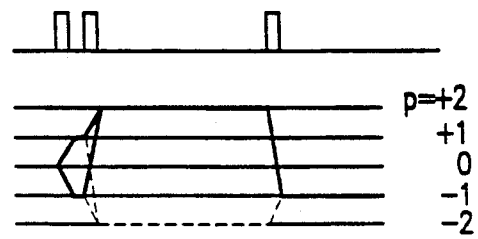

FIGS. 3A and 3B illustrate coherence transfer pathways for single-quantum coherence and double-quantum coherence, respectively. As described by Ernst et al. supra, page 294, in homo-nuclear 2D correlation spectroscopy, the preparation period (e.g. a single $\pi/2$ pulse) excites single-quantum coherence of orders $p=\pm 1$ which are transferred into observable coherence ($p=-1$) by a mixing propagator or single rf pulse. In double-quantum spectroscopy, the preparation propagator can be a series of pulses which excite coherence of order $p=\pm 2$, which are converted into observable $p=-1$ coherence by a suitable mixing propagator.

Figure 4A:
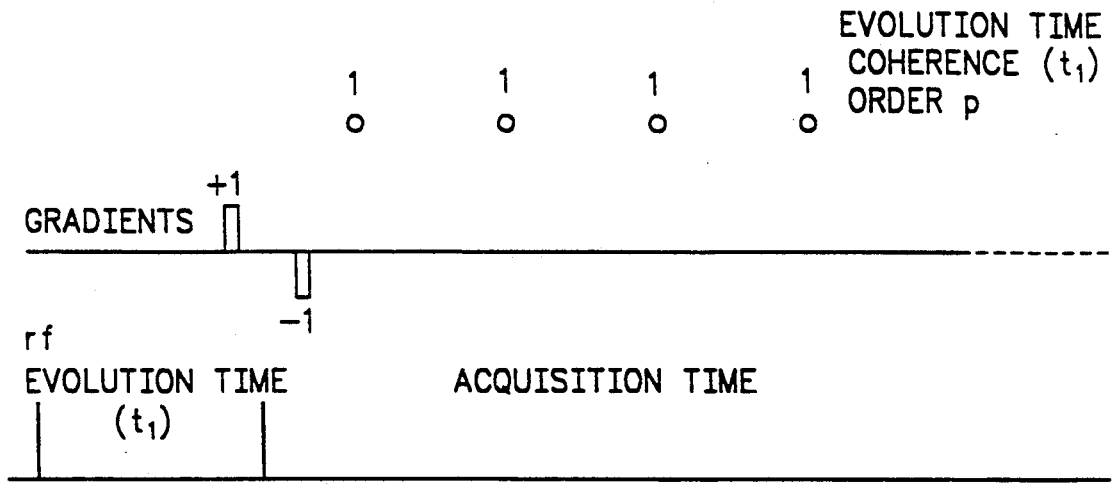
FIGS. 4A and 4B illustrate the acquisition of data in two coherence transfer pathways in accordance with the prior art.
Figure 4B:
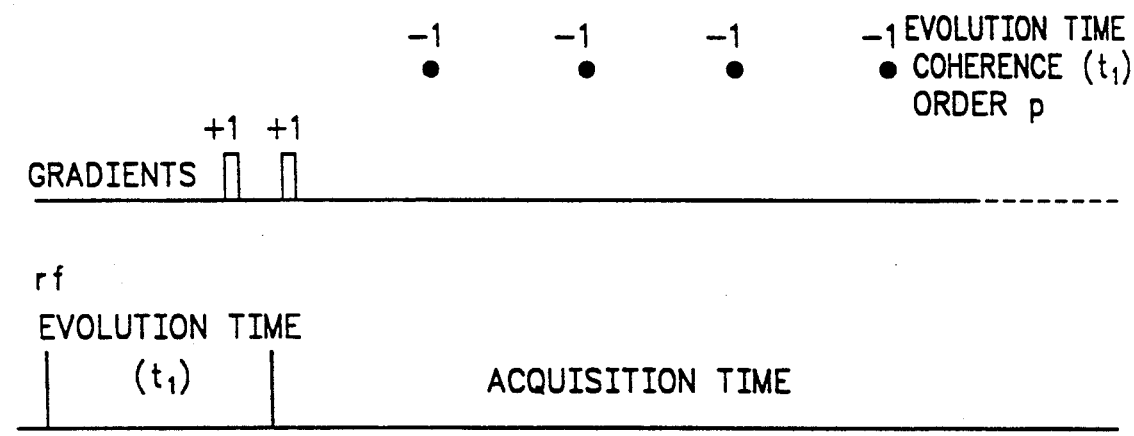

FIGS. 4A and 4B illustrate conventional acquisition of data using gradients to obtain two transfer pathways, corresponding to $p=\pm 1$, shown in FIG. 3A. Two separate data acquisition sequences are employed, first to obtain data at data points (illustrated by circles) in FIG. 4A following excitation and the application of a gradient for selecting the $p=+1$ coherence transfer pathway, and then in a separate acquisition to obtain data at data points (illustrated by dots) in FIG. 4B following excitation and the application of a gradient for selecting the $p=-1$ coherence transfer pathway. Relative gradient values of $+1$ and $-1$ are used for illustration purposes.

Figure 5:
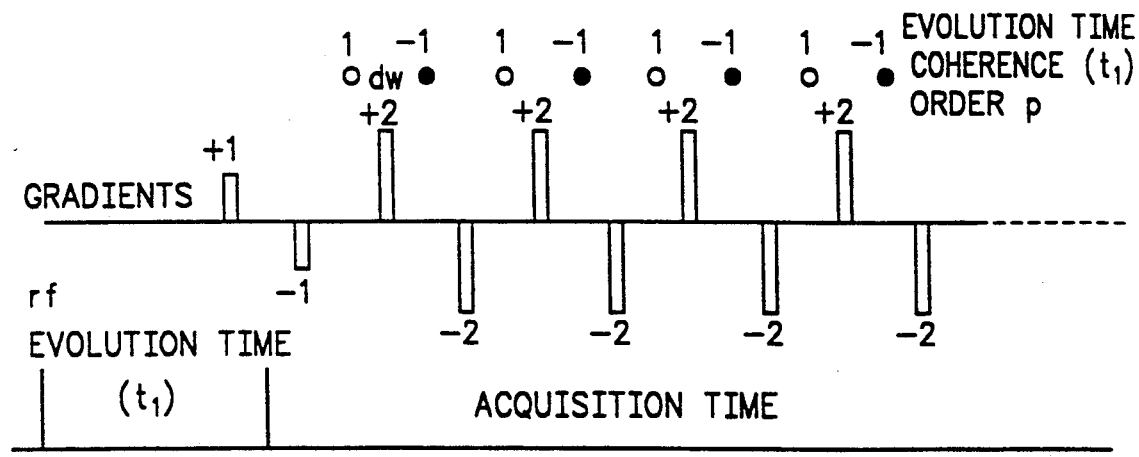
FIG. 5 illustrates the acquisition of data in two coherence transfer pathways in accordance with our co-pending application.

In accordance with the invention of our co-pending application Ser. No. 07/678,831, supra, the data for all data points from all pathways in FIGS. 4A, 4B are obtained in a single acquisition as illustrated in FIG. 5. In this embodiment for two coherence transfer pathways, the pathway selection gradients or acquisition time gradients are switched to encode and detect both pathways during a single NMR acquisition. Following data acquisition at a data point for one pathway, the acquisition gradient is effectively altered to select a data point from the other coherence transfer pathway.

Accordingly, by gradient refocusing of each pathway in turn between digitizer sampling points, signals from both coherence pathways are individually encoded and detected in the course of a time period equal to the time period for a single pathway as in the prior art of FIGS. 3A, 3B.

Figure 6:
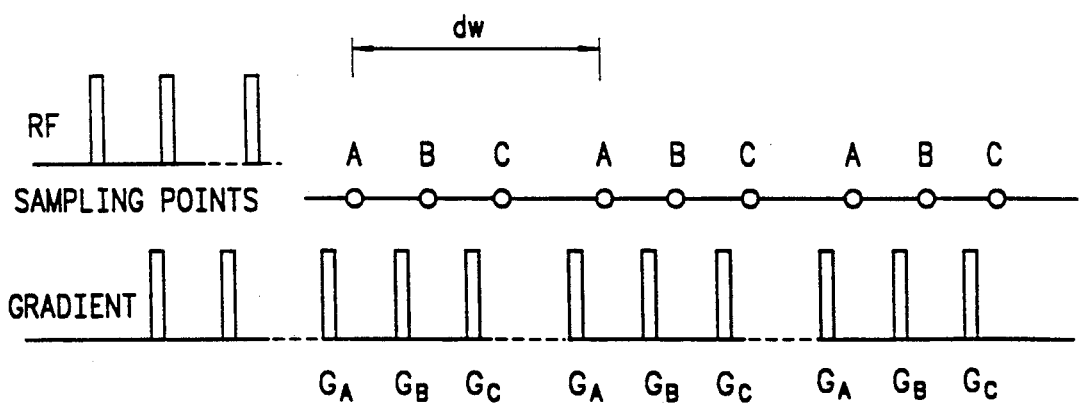
FIG. 6 illustrates the acquisition of data for the selection of three coherence transfer pathways in accordance with our co-pending application.

FIG. 6 illustrates the acquisition of data in a set of three coherence transfer pathways in accordance with the invention. In each embodiment, the selection of multiple pathways requires the digitizer to be operated with a shorter dwell time than in a conventional acquisition in a single pathway.

The switched acquisition time gradient pulse train technique makes detection of signals from multiple pathways in a single acquisition possible by gradient refocusing of each pathway in turn between digitizer sampling points and acquisition of the corresponding signals. Thus, in the course of a time period equal to the normal sampling interval, signals arising from all of the desired coherence pathways are individually encoded and detected.

The present invention is directed to obtaining pure absorption two-dimensional line shapes from the detected signals from multiple coherence transfer pathways using switched acquisition time gradients. In the simplest case illustrated by FIG. 5, the alternate dwell points can be separated into two files containing the different coherence order data and then appropriately recombined during processing. Quadrature detection is obtained since the modulation during the time $t_1$ evolution period includes sine and cosine terms. However, the modulation also includes sine and cosine modulation which must be separated. Heretofore the separation has been achieved by acquisition of a complete additional 90 degree phase shifted set of $t_1$-evolution data.

Figure 7A:
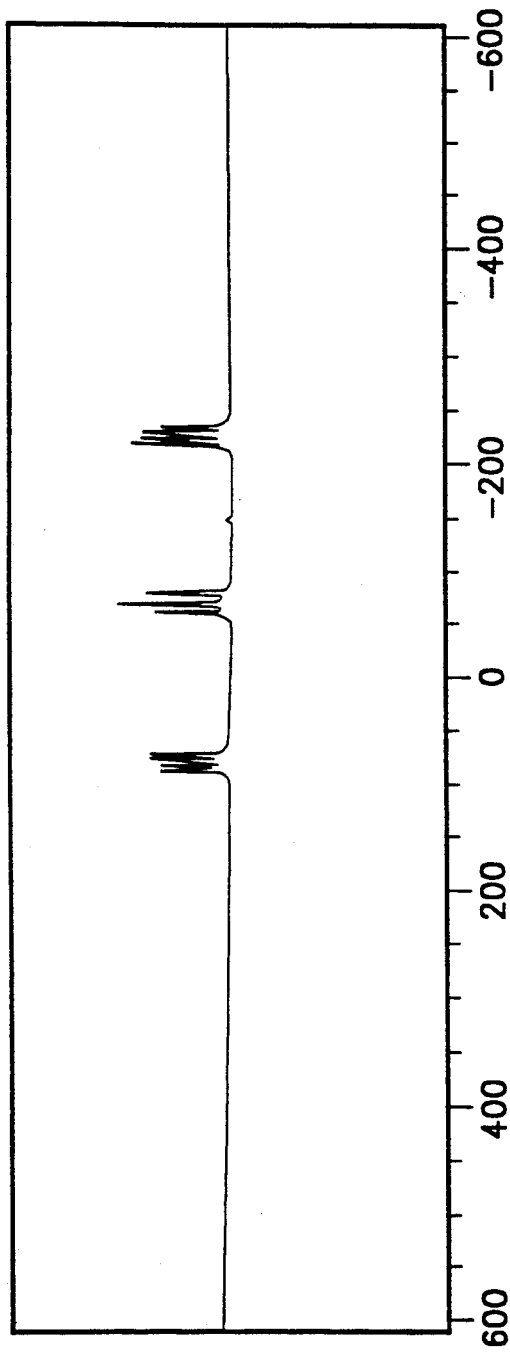
FIGS. 7A and 7B illustrate unshifted detected signals and frequency shifted detected signals, respectively.
Figure 7B:
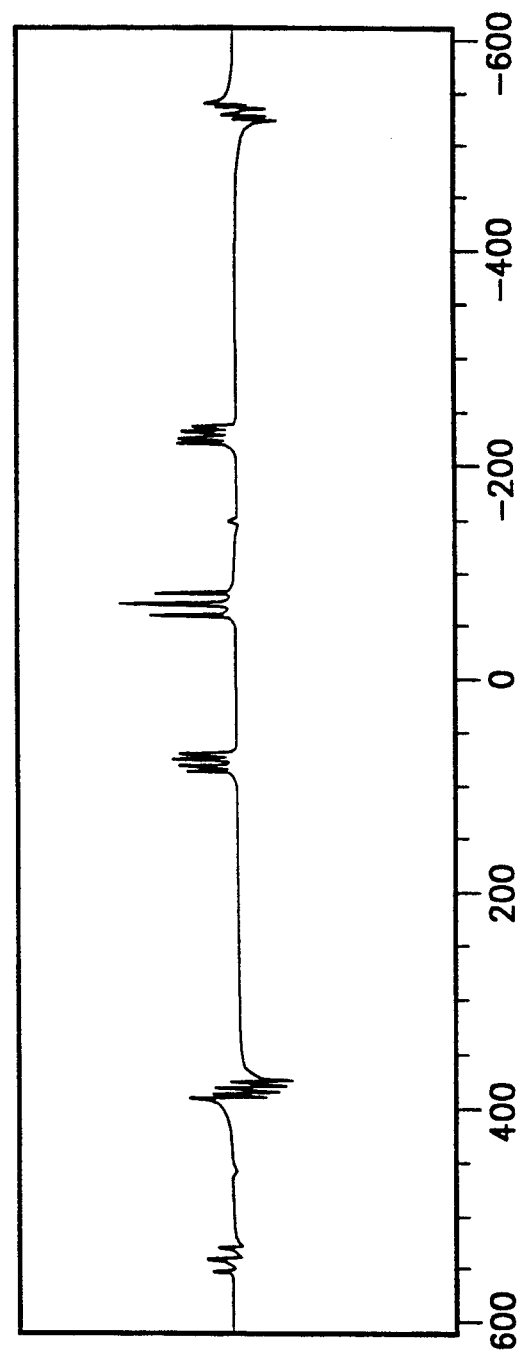

FIGS. 7A and 7B represent blocks of COSY data collected without and with switched acquisition gradients.

FIG. 7A illustrates the real portion of complex data for an arbitrary frequency range selected based on the chemical makeup of molecules of material undergoing spectroscopy. However, the components of the different coherence pathways which evolve as sine in $\omega_1$ alternate by 180 degrees in phase along the SWAT $t_2$ domain and are hence shifted by the Nyquist frequency on $\omega_2$ while the cosine components keep the same sign as illustrated in FIG. 7B and can be observed at their normal chemical shift.

Figure 8:
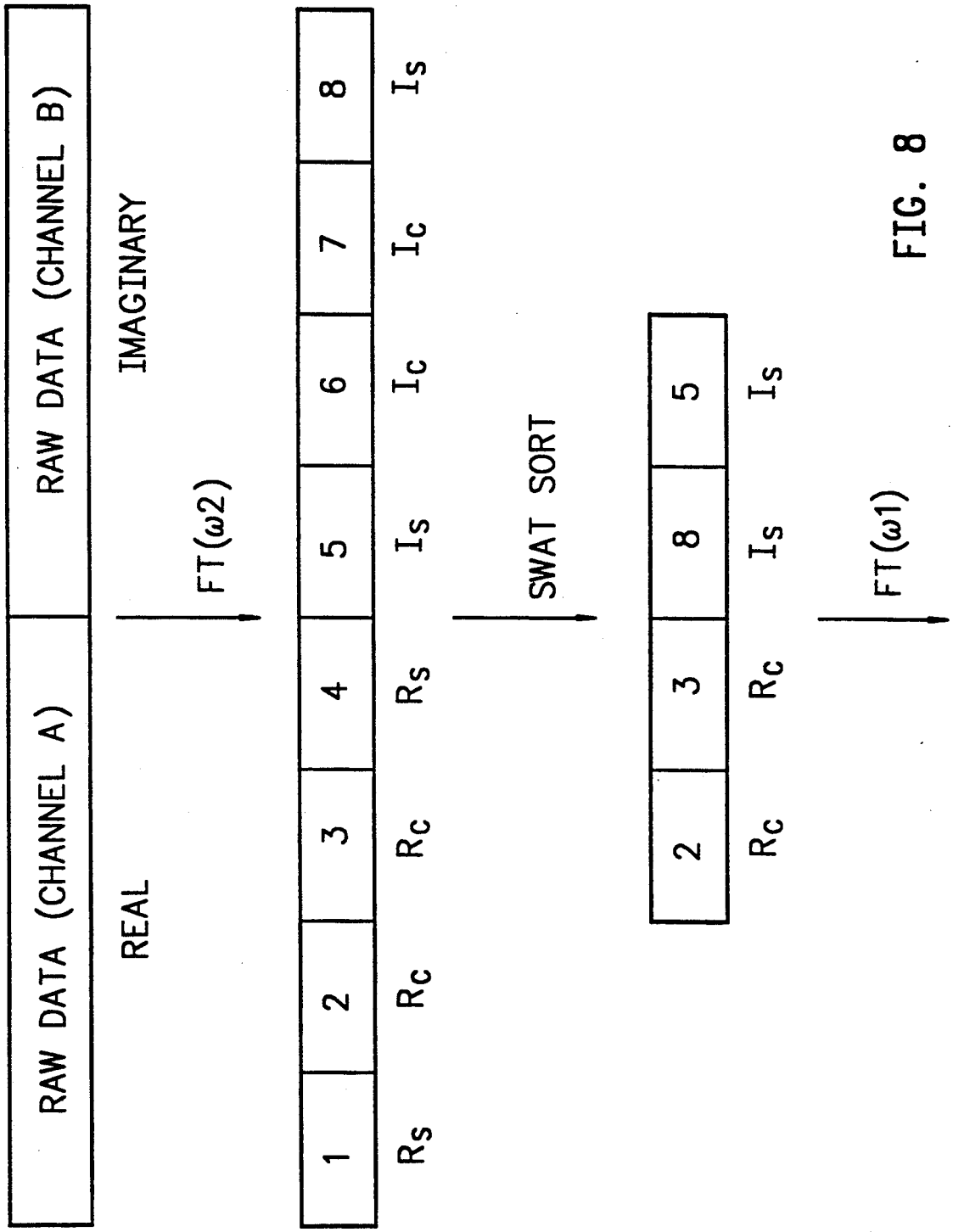
FIG. 8 illustrates the selective combination of real and imaginary data components in reconstructing the detected data.

FIG. 8 illustrates the detection of raw data for the real component (channel A) and for the imaginary component (channel B). Following complex Fourier transformation of these data the real and imaginary domains can be conveniently divided into four frequency ranges (1-4 for the real channel and 5-8 for the imaginary channel) which correspond to the frequency ranges in FIGS. 7B as noted. Due to the phase shifting of the sine components, the real sine components are located in blocks 1 and 4 while the unshifted cosine signal components are in blocks 2 and 3. Similarly, for the imaginary data obtained by quadrature detection, the imaginary sine components are in blocks 5 and 8 and the unshifted cosine components are in blocks 6 and 7. The detected data is reconstructed by combining the real portions of the cosine components (blocks 2 and 3) with the imaginary parts of the sine components (blocks 5 and 8) as noted. The resulting phase sensitive complex data is then complex Fourier transformed along the $t_1$ evolution dimension to yield a phase sensitive COSY spectrum such as illustrated in FIG. 9.

Figure 9:
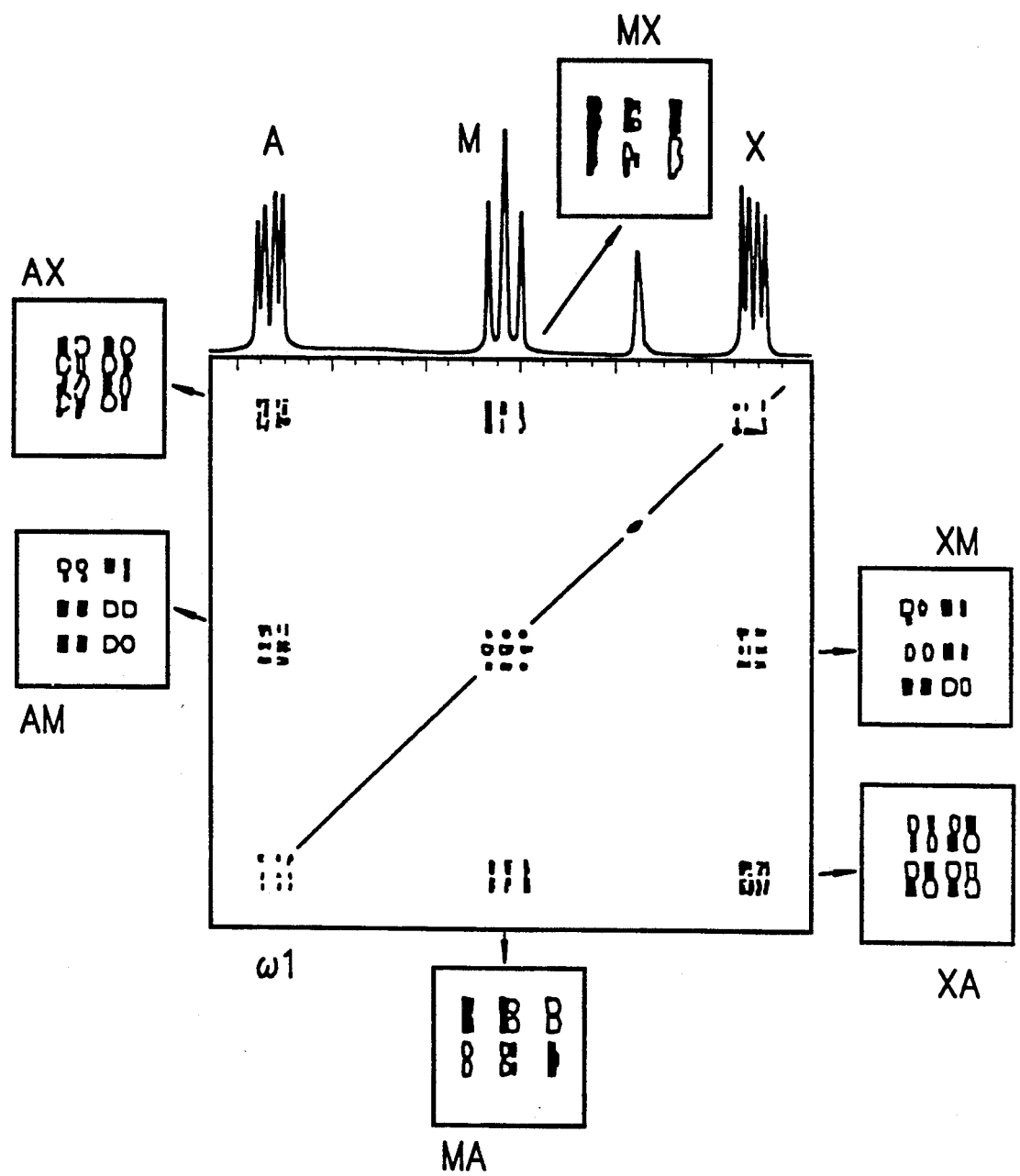
FIG. 9 illustrates a phase sensitive COSY spectrum formed from complex Fourier transformation of the reconstructed NMR data.

FIG. 9 is a contour plot of a 300 Mhz pure phase COSY spectrum of 2,3-dibromopropionic acid acquired with a single acquisition per $t_1$-evolution time increment using the method in accordance with the invention. Cross peaks are shown in expanded insets, and positive peaks are shown as dark in the contours and negative peaks are shown as open contours. A one-dimensional spectrum is plotted across the top of the spectrum.

The described invention obtains pure phase information in quadrature detection by obtaining both real and imaginary signals and then selectively combining the components of the real and imaginary data which evolve as sine and cosine amplitudes in $t_1$. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. A method of constructing a frequency-domain spectrum of NMR spectroscopy data $S(\omega_1,\omega_2)$ where $\omega_1$ and $\omega_2$ are two independent frequency variables) from a single acquisition of time domain signals $S(t_1,t_2)$ where $t_1$ and $t_2$ are two independent time variables) obtained by using switched acquisition time gradients comprising the steps of quadrature detecting the time domain signals $S(t_1,t_2)$ to obtain real components and imaginary components, Fourier transforming said time domain signals $S(t_1,t_2)$ in the $t_2$ dimension and producing real ($\omega_2$) and imaginary ($\omega_2$) components which modulate as sine and cosine functions with respect to $t_1$, separating the real ($\omega_2$) cosine ($t_1$) components and the imaginary ($\omega_2$) sine ($t_1$) components, combining said real ($\omega_2$) cosine ($t_1$) components and said imaginary ($\omega_2$) sine ($t_1$) components to construct a complex absorption only, data set that is amplitude modulated in $t_1$, and Fourier transforming said complex data set in $t_1$ to obtain a frequency-domain spectrum of NMR spectroscopy data.

2. A method of obtaining a frequency-domain spectrum of NMR spectroscopy data $S(\omega_1,\omega_2)$ where $\omega_1$ and $\omega_2$ are two independent frequency variables) from a single data acquisition in coherence transfer pathways in a molecular system using switched acquisition time gradients comprising the steps of preparing said molecular system in a coherent non-equilibrium state, alternately and sequentially quadrature detecting NMR signals $S(t_1,t_2)$ where $t_1$ and $t_2$ are two independent time variables) at sampling points in said plurality of coherence transfer pathways using gradient refocusing of a pathway after signal detection of another pathway, transforming said NMR signals $S(t_1,t_2)$ into first transformed signals $S(t_1,\omega_2)$ having real and imaginary components which modulate as sine and cosine functions with respect to $t_1$, combining real ($\omega_2$) cosine ($t_1$) components and imaginary ($\omega_2$) sine $t_1$ components to construct a complex data set, and transforming said complex data set in $t_1$ to obtain the frequency-domain spectrum.

3. In multidimensional spectroscopy of a molecular system, a method of obtaining a frequency-domain spectra of NMR spectroscopy data $S(\omega_1,\omega_2)$ where $\omega_1$ and $\omega_2$ are two independent frequency variables) from a single acquisition of time-domain signals $S(t_1,t_2)$ where $t_1$ and $t_2$ are two independent time variables from coherence transfer pathways using switched acquisition time gradients comprising the steps of a) placing said molecular system in a static magnetic field, b) applying a time sequence of rf and gradient pulses to said molecular system whereby spins are prepared in a coherent coherence-order-labeled non-equilibrium state, c) applying a focusing gradient to said molecular system for selecting a first coherence transfer pathway for detecting time domain data, d) quadrature detecting time domain data at a first data sampling point from said first coherence transfer pathway, e) applying a first refocusing gradient to said molecular system for selecting a second coherence transfer pathway, f) quadrature detecting time domain data at a first data sampling point from said second coherence transfer pathway, g) applying a second refocusing gradient to said molecular system for selecting said first coherence transfer pathway, h) quadrature detecting data at a second data point in said first coherence transfer pathway, i) repeating steps e) through h) for detecting data at other data sampling points in said first coherence transfer pathway and said second coherence transfer pathway, j) transforming all data obtained by quadrature detection into first Fourier transformed signals at each data sampling period, said signals having real and imaginary components which modulate as sine and cosine functions with respect to $t_1$, k) combining real ($\omega_2$) cosine ($t_1$) components and imaginary ($\omega_2$) sine ($t_1$) components at each data sampling to construct a complex data set, and transforming each complex data set to obtain a frequency-domain spectrum at each data sampling point.

* * * * *